(12) United States Patent
Crema

(10) Patent No.: US 11,640,931 B2
(45) Date of Patent: May 2, 2023

(54) DIE ATTACHMENT METHOD AND MATERIAL BETWEEN A SEMICONDUCTOR DEVICE AND DIE PAD OF A LEADFRAME

(71) Applicant: STMICROELECTRONICS S.R.L., Agrate Brianza (IT)

(72) Inventor: Paolo Crema, Vimercate (IT)

(73) Assignee: STMICROELECTRONICS S.r.l., Agrate Brianza (IT)

(*) Notice: Subject to any disclaimer, the term of this patent is extended or adjusted under 35 U.S.C. 154(b) by 210 days.

(21) Appl. No.: 16/899,342

(22) Filed: Jun. 11, 2020

(65) Prior Publication Data
US 2020/0402895 A1    Dec. 24, 2020

(30) Foreign Application Priority Data

Jun. 19, 2019  (IT) .................... 102019000009501

(51) Int. Cl.
*H01L 23/495*   (2006.01)
*H01L 21/48*    (2006.01)
(Continued)

(52) U.S. Cl.
CPC .... *H01L 23/49513* (2013.01); *H01L 21/4821* (2013.01); *H01L 21/563* (2013.01);
(Continued)

(58) Field of Classification Search
CPC ......... H01L 24/30; H01L 24/33; H01L 24/83; H01L 24/05; H01L 24/13; H01L 24/16;
(Continued)

(56) References Cited

U.S. PATENT DOCUMENTS 6,034,422 A * 3/2000 Horita ............... H01L 24/85
                                                  257/677
7,382,059 B2   6/2008 Anderson et al.
(Continued)

FOREIGN PATENT DOCUMENTS

CN    103594448 A     2/2014
CN    108436270 A *   8/2018  ........... B08B 7/0042

OTHER PUBLICATIONS

Lager et al., "Advanced Non-Etching Adhesion Promoter for Next Generation IC Packaging," *2014 9th International Microsystems, Packaging, Assembly and Circuits Technology Conference (IMPACT)*, Taipei, Taiwan, Oct. 22-24, 2014, pp. 220-225.
(Continued)

*Primary Examiner* — Alonzo Chambliss
(74) *Attorney, Agent, or Firm* — Seed IP Law Group LLP

(57) ABSTRACT

Manufacturing a semiconductor device, such as an integrated circuit, comprises: providing a leadframe having a die pad area, attaching onto the die pad area of the leadframe one or more semiconductor die or dice via soft-solder die attach material, and forming a device package by molding package material onto the semiconductor die or dice attached onto the die pad area of the leadframe. An enhancing layer, provided onto the leadframe to counter device package delamination, is selectively removed via laser beam ablation from the die pad area, and the semiconductor die or dice are attached onto the die pad area via soft-solder die attach material provided where the enhancing layer has been removed to promote wettability by the soft-solder material.

20 Claims, 2 Drawing Sheets

(51) Int. Cl.
*H01L 21/56* (2006.01)
*H01L 23/31* (2006.01)
*H01L 23/00* (2006.01)

(52) U.S. Cl.
CPC .... *H01L 23/3107* (2013.01); *H01L 23/49503* (2013.01); *H01L 23/49534* (2013.01); *H01L 23/49582* (2013.01); *H01L 24/13* (2013.01); *H01L 24/30* (2013.01); *H01L 24/33* (2013.01); *H01L 24/83* (2013.01)

(58) Field of Classification Search
CPC ............. H01L 23/3142; H01L 23/3107; H01L 23/49503; H01L 2924/181; H01L 2924/014; H01L 23/49513; H01L 23/49534; H01L 23/49582; H01L 21/53; H01L 21/4821; H01L 21/563
See application file for complete search history.

(56) References Cited

U.S. PATENT DOCUMENTS

| | | | |
|---|---|---|---|
| 8,298,869 B2* | 10/2012 | Maeda | H01L 23/3121 257/E21.504 |
| 8,400,777 B2 | 3/2013 | Ide et al. | |
| 9,653,385 B1 | 5/2017 | Fang | |
| 2005/0224940 A1 | 10/2005 | Tangpuz et al. | |
| 2008/0061414 A1* | 3/2008 | Retuta | H01L 23/49582 257/676 |
| 2009/0250796 A1 | 10/2009 | Tsui et al. | |
| 2011/0303945 A1* | 12/2011 | Zitzlsperger | H01L 33/62 257/E31.117 |
| 2012/0153444 A1* | 6/2012 | Haga | H01L 24/83 257/737 |
| 2014/0264383 A1* | 9/2014 | Kajiwara | H01L 23/49513 257/77 |
| 2016/0049381 A1 | 2/2016 | Ryu et al. | |
| 2019/0157196 A1* | 5/2019 | Sonehara | H01L 21/4828 |
| 2020/0273720 A1* | 8/2020 | Stiborek | H01L 23/4952 |
| 2021/0167022 A1* | 6/2021 | Crema | H01L 21/4825 |

OTHER PUBLICATIONS

Neoh et al., "Enhancing High Temperature Adhesion Performance via a Renovated Leadframe Surface Treatment," *2020 China Semiconductor Technology International Conference (CSTIC)*, Shanghai, China, Jun. 26-Jul. 17, 2020, pp. 1-8.

* cited by examiner

DIE ATTACHMENT METHOD AND MATERIAL BETWEEN A SEMICONDUCTOR DEVICE AND DIE PAD OF A LEADFRAME

BACKGROUND

Technical Field

The description relates to manufacturing semiconductor devices.

One or more embodiments may be applied to manufacturing integrated circuits (ICs).

Description of the Related Art

Providing packaged semiconductor devices with improved resistance to package delamination represents a growing trend in manufacturing semiconductor devices (for the automotive sector, for instance).

An approach in providing such a desired feature involves forming a so-called enhancing layer having an increased affinity with package molding compounds (epoxy molding compounds, for instance).

It is noted that such an enhancing layer may negatively affect the process of attaching a semiconductor die on the die pad area of the leadframe, via soft-solder, for instance.

That problem has been attempted to be dealt with by modifying the soft-solder die attach parameters (high temperature, high air forming gas flow, and so on) without appreciable improvement found to take place.

BRIEF SUMMARY

One or more embodiments may relate to a semiconductor device (an integrated circuit, for instance).

The claims are an integral part of the technical teaching provided herein in respect of the embodiments.

One or more embodiments may involve (selective) removal of the enhancing layer via laser beam ablation in order to restore wettability of the underlying material (silver, for instance) which facilitates soft-solder die attachment.

One or more embodiments may rely on the recognition that a current approach in providing an enhancing layer is by processing a silver layer (silver spot) provided on the basic metal material of the leadframe (copper, for instance). Laser ablation of such an enhancing layer (silver oxide) was found to give rise to "cleaned" surface modified (melted and/or refined) in a manner that (further) facilitates soft-solder die attach.

BRIEF DESCRIPTION OF THE SEVERAL VIEWS OF THE DRAWINGS

One or more embodiments will now be described, by way of example only, with reference to the annexed figures, wherein.

DETAILED DESCRIPTION

In the ensuing description one or more specific details are illustrated, aimed at providing an in-depth understanding of examples of embodiments. The embodiments may be obtained without one or more of the specific details, or with other methods, components, materials, etc. In other cases, known structures, materials, or operations are not illustrated or described in detail so that certain aspects of embodiments will not be obscured.

Reference to "an embodiment" or "one embodiment" in the framework of the present description is intended to indicate that a particular configuration, structure, or characteristic described in relation to the embodiment is comprised in at least one embodiment. Hence, phrases such as "in an embodiment" or "in one embodiment" that may be present in one or more points of the present description do not necessarily refer to one and the same embodiment. Moreover, particular conformations, structures, or characteristics may be combined in any adequate way in one or more embodiments.

The references used herein are provided merely for convenience and hence do not define the extent of protection or the scope of the embodiments.

Figure 1:
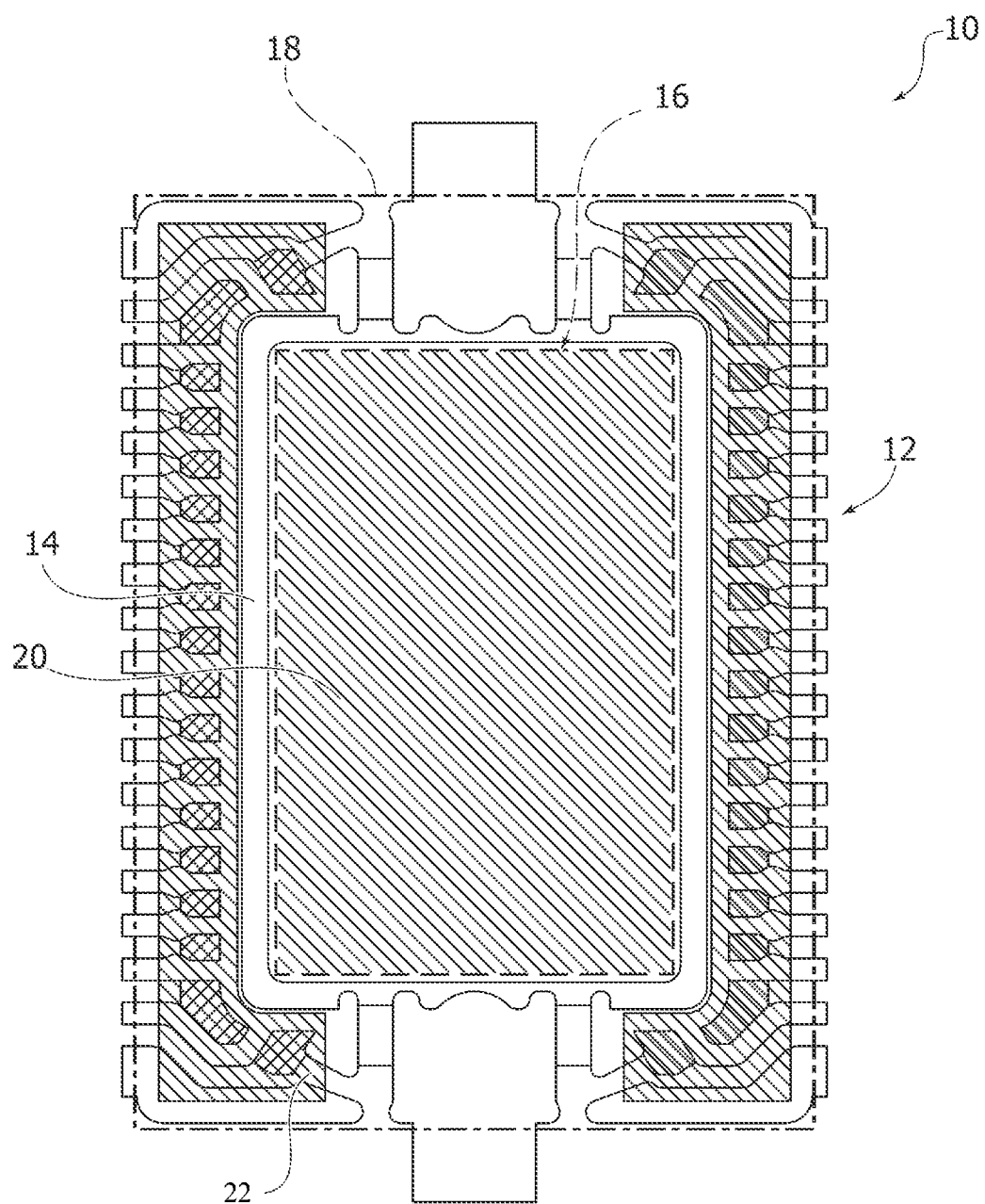
FIG. 1 is an exemplary representation of a semiconductor device adapted to be manufactured according to embodiments.

FIG. 1 is a schematic representation of a semiconductor device 10 such as an integrated circuit observed in a plan (top) view.

A device 10 as exemplified herein comprises a so-called leadframe 12 having a (central, for instance) die pad area 14 and (at least) one semiconductor chip or die 16 attached onto the die pad area 14 of the leadframe 12 via a soft-solder process.

A package 18 can be molded onto the semiconductor die or dice 16 attached onto the die pad area 14 of the leadframe 12 to provide a device package having the external (distal) tips of the leads in the leadframe 12 protruding from the package 18.

Some of the general structure and manufacturing process of the semiconductor device 10 as exemplified in FIG. 1 (such as the provision of various additional elements such as wire bonding coupling the leads of the leadframe to the semiconductor die or dice, and so on, not visible in the figure) are well known to those of skill in the art, which makes it unnecessary to provide a more detailed description herein of the known portion of the structure and process.

A conventional solution for manufacturing a device such as the semiconductor device 10 exemplified herein may involve providing a leadframe 12 in the form of (ribbon-like) strip of metal material such as copper. Such a strip may comprise plural sections indicated 13 in FIG. 2. Each of these includes a respective die pad area 14 onto which respective semiconductor dice can be attached.

The various sections of the ribbon-like structure can be eventually separated ("singulated") prior to or following molding of respective packages 18 to provide individual devices.

Figure 2:
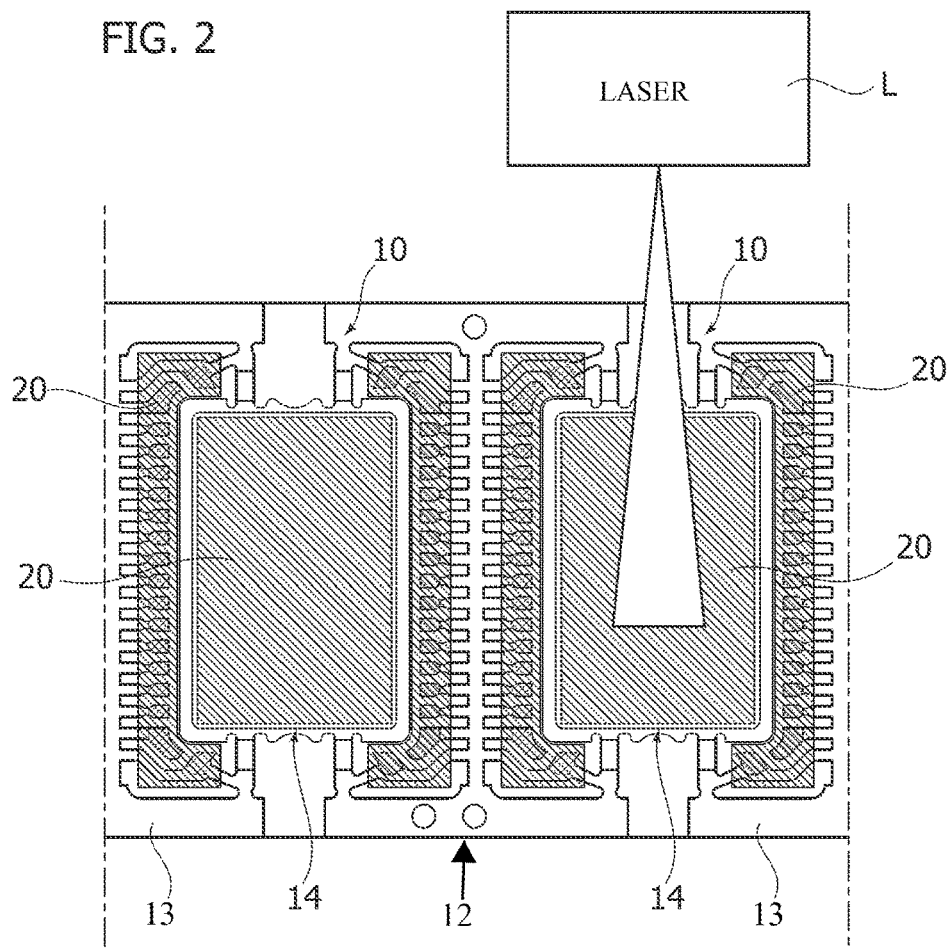
FIG. 2 is exemplary of a possible act in embodiments, and FIG. 3 essentially corresponds to a cross-sectional view along line in FIG. 2 reproduced in an enlarged scale.
Figure 3:
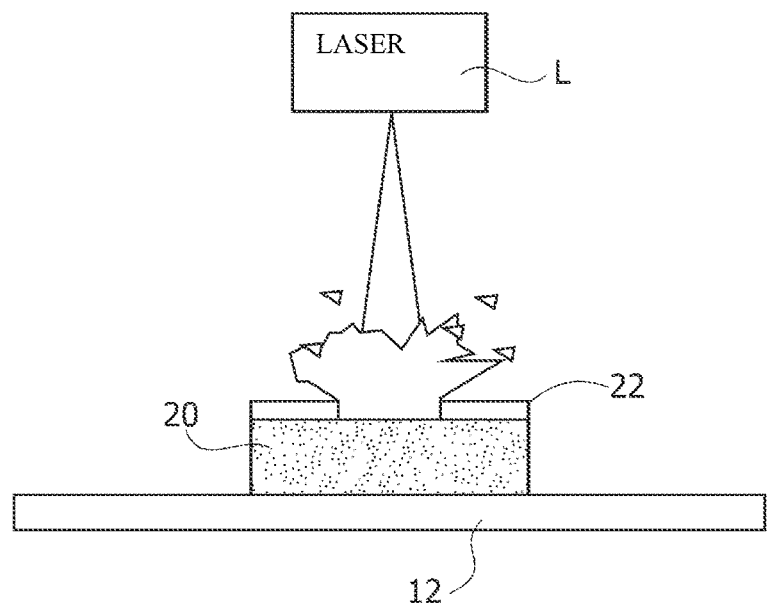

Shown in FIGS. 1-3 is a metal coating 20 that is wetted onto the leadframe. The metal coating 20 is of a metal different from the metal of the leadframe 12, such as silver for a copper leadframe. The metal coating 20 is used to improve bonding of the soft solder, which is applied to the bottom surface of the semiconductor chip or die 16, onto the die pad area 14 of the leadframe 12.

The process also involves forming an enhancing layer 22 on the top surface of the metal coating. The enhancing layer 22 has a higher affinity with the molding compound 18 which is eventually molded onto the leadframe 12 and the semiconductor die or dice 16 attached thereon. The enhancing layer 22 may be formed by processing the top surface of the metal coating 20.

Such a molding compound may conventionally comprise resin material such as epoxy resin molding compound (EMC=Epoxy Molding Compound).

Because the metal coating may be made of a precious metal, such as silver, which are expensive materials, the metal coating 20 may be in the form of a collection of spots rather than a continuous layer/coating. In particular, the metal coating 20 may be applied spot-like in order to limit use of the (precious) metal plating.

For instance, according to the treatment process designated NEAP 4.0 (NEAP=Non-Etching Adhesion Promoter), the enhancing layer 22 may be an upper layer (3-10 nm) of silver oxide (AgOx) is formed "on top" of the silver coating 20.

While promoting good adhesion with the package compound, the enhancing layer 22 was found to adversely affect the attachment process of the semiconductor die or dice 16 onto the die pad 14 of the leadframe 12.

Even without wishing to be bound to any specific theory in that respect, the enhancing layer 22 may negatively affect "wettability" of the leadframe material (copper 12 coated by silver 20) by soft-solder attach material.

A composition of Pb 95%/Sn 5% or sometimes Pb with 1-2% Ag and Sn balance may be exemplary of such soft-solder attach materials.

As schematically represented in FIGS. 2 and 3, one or more embodiments may contemplate selectively removing the enhancing layer 22 at the region of the die pad 14 onto which the semiconductor die or dice 16 is attached.

The wording "at" is intended to highlight the fact that selective removal of the enhancing layer 22 does not necessarily have to involve the entirety of die pad area onto which the semiconductor die or dice 16 is attached. An increase of the area where (soft-solder) attach may take place without being adversely affected by the enhancing layer was however found to be beneficial.

Laser beam ablation by a laser L in FIGS. 2 and 3 was found to be effective in performing such a selective removal of the enhancing layer with the capability of restoring the original wettability of the underlying coating 20 (for instance "pure" silver, as in the case exemplified in FIG. 3).

Selective removal of the enhancing layer 22 by laser beam ablation was found to result in "cleaning" the surface of the leadframe from which the enhancing layer is removed (for instance the surface of the silver coating 20 in FIG. 3) with an effect of that surface being melted and/or roughened.

This was found to be beneficial in (further) promoting adhesion of the soft-solder material onto the leadframe and facilitating anchoring of the semiconductor die or dice 16 thereon, with reduced risk of delamination.

Again, without wishing to be bound to any specific theory in that respect, such a surface melting/roughening may result in the contact surface of the soft-solder material to the leadframe being increased, thus giving rise to a synergistic increased wettability/increased contact surface resulting from (selective) removal of the enhancing layer.

Experiments performed by the applicants show that laser beam radiation at a wavelength at about 1064 nm as produced by a YAG laser with specific power of 100 watt @ 1 MHz (pulsed with pulse duration of 15 pSec) may provide firm soft-solder die attachment onto a silver-coated leadframe while an AgOx enhancing layer left in place onto the portions of the leadframe eventually contacted by the package molding compound facilitate satisfactory package delamination performance as desired.

As exemplified herein, a method of manufacturing semiconductor devices (for instance, 10) may comprise:

providing a leadframe (for instance, 12) having a die pad area (for instance, 14), attaching onto said die pad area at least one semiconductor die (for instance, 16) via soft-solder die attach material, forming a device package (for instance, 18) by molding package material onto the at least one semiconductor die attached onto said die pad area of the leadframe, wherein the method comprises:

providing onto said leadframe an enhancing layer (for instance, 22) countering device package delamination, removing (for instance, L) said enhancing layer from at least a portion of the die pad area, and attaching said at least one semiconductor die onto said die pad area via soft-solder die attach material provided where said enhancing layer has been removed.

A method as exemplified herein may comprise removing said enhancing layer from said die pad area via laser beam ablation.

In a method as exemplified herein, said enhancing layer may comprise processed silver, optionally Non-Etching Adhesion Promoter (NEAP)-processed.

A method as exemplified herein may comprise:

forming said leadframe of a first metal material, forming onto said leadframe a layer of a second metal material, and processing the surface of said second metal material opposite the first metal material to provide said enhancing layer.

In a method as exemplified herein, said first metal material may comprises copper.

In a method as exemplified herein, said second material may comprise silver.

A semiconductor device (for instance, 10) as exemplified herein may comprise:

a leadframe (for instance, 12) having a die pad area (for instance, 14), at least one semiconductor die (for instance, 16) attached onto said die pad area (14) via soft-solder die attach material, a device package (for instance, 18) of package material molded onto the at least one semiconductor die attached onto said die pad area of the leadframe, wherein:

an enhancing layer (for instance, 22) is provided on said leadframe, the enhancing layer countering device package delamination, wherein said die pad area of the leadframe is at least partially exempt (for instance, L) from said enhancing layer, and the at least one semiconductor die is attached onto said die pad area via soft-solder die attach material provided where the die pad area of the leadframe is exempt from said enhancing layer.

In a device as exemplified herein, where exempt from said enhancing layer, the die pad area of the leadframe may have a roughened surface wetted by said soft-solder die attach material.

In a device as exemplified herein:

said leadframe may comprise a first metal material, optionally copper, having formed thereon a layer of a second metal material, optionally silver, and said enhancing layer may comprise a processed (optionally Non-Etching Adhesion Promoter or NEAP)-processed layer of said second metal material.

Without prejudice to the underlying principles, the details and embodiments may vary, even significantly, with respect to what has been described by way of example only without departing from the scope of protection.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method of manufacturing semiconductor devices, the method comprising:
    forming an enhancing layer on a die pad area and leads of a leadframe the enhancing layer configured to counter device package delamination and the leads being around the die pad area;
    removing all of the enhancing layer from the die pad area, the enhancing layer remaining on the leads;
    after removing all of the enhancing layer from the die pad area, attaching onto the die pad area a semiconductor die via soft-solder die attach material; and
    forming a device package by molding package material onto the semiconductor die attached onto the die pad area of the leadframe.

2. The method of claim 1, wherein removing the enhancing layer from the die pad area includes laser beam ablating the enhancing layer.

3. The method of claim 2, wherein removing laser beam ablating the enhancing layer further includes roughening a surface of the die pad area.

4. The method of claim 1, wherein the enhancing layer comprises processed silver.

5. The method of claim 1, wherein
    the leadframe is of a first metal material; and
    providing the enhancing layer onto the die pad area and the leads of the leadframe includes:
        forming onto the die pad area and the leads of the leadframe a layer of a second metal material, the layer of the second metal material having a first side facing the leadframe and a second side opposite to the first side; and
        processing a surface of the second side of the second metal material.

6. The method of claim 5, wherein the first metal material comprises copper.

7. The method of claim 5, wherein the second material comprises silver.

8. The method of claim 1, further comprising forming the enhancing layer on the die pad area of the leadframe further includes forming the enhancing layer on a metal coating layer on the leadframe.

9. A semiconductor device, comprising:
    a leadframe having a die pad area and leads around the die pad area, the leadframe having a first surface on the die pad area and a plurality of second surfaces on the leads;
    an enhancing layer on the second surfaces on the leads of the leadframe, the enhancing layer including an opening that exposes the entire first surface of the die pad area, the enhancing layer being configured to counter device package delamination;
    a semiconductor die coupled to the first surface of the die pad area via soft-solder die attach material; and
    a device package of package material molded onto the semiconductor die attached onto the die pad area of the leadframe.

10. The device of claim 9, in which, the die pad area of the leadframe has a roughened surface wetted by the soft-solder die attach material.

11. The device claim 9, wherein:
    the leadframe comprises a first metal material; and
    a layer of a second metal material, wherein the enhancing layer comprises a processed layer of the second metal material.

12. The device claim 11, wherein:
    the first metal material is copper; and
    the second metal material is silver.

13. The method of claim 9, further comprising the enhancing layer provided on a plurality of leads of the leadframe.

14. The semiconductor device of claim 9, further comprising a metal coating, wherein the metal coating layer includes the first surface of the die pad area, the metal coating layer is at the die pad area, and the metal coating layer is between the leadframe and the enhancing layer.

15. A method, comprising:
    forming on a metal coating layer on a die pad area and forming on leads of a leadframe, an enhancing layer configured to counter device package delamination;
    laser ablating the enhancing layer removing all of the enhancing layer from the metal coating layer on the die pad area, the enhancing layer remaining on the leads; and
    after laser ablating the enhancing layer, attaching onto metal coating layer on the die pad area a semiconductor die via soft-solder die attach material.

16. The method of claim 15, wherein the enhancing layer comprises processed silver.

17. The method of claim 15, wherein
    the leadframe is of a first metal material; and
    forming the enhancing layer:
        forming onto the die pad area and the leads of the leadframe a layer of a second metal material, the layer of the second metal material having a first side facing the leadframe and a second side opposite to the first side; and
        processing a surface of the second side of the second metal material.

18. The method of claim 17, wherein the first metal material comprises copper.

19. The method of claim 18, wherein the second material comprises silver.

20. The method of claim 15, wherein laser ablating the enhancing layer removing all of the enhancing layer from the die pad area further includes roughening a surface of the die pad area.

* * * * *

UNITED STATES PATENT AND TRADEMARK OFFICE
CERTIFICATE OF CORRECTION

PATENT NO. : 11,640,931 B2
APPLICATION NO. : 16/899342
DATED : May 2, 2023
INVENTOR(S) : Paolo Crema It is certified that error appears in the above-identified patent and that said Letters Patent is hereby corrected as shown below:

In the Claims

Column 6, Claim 11, Line 12:
"The device claim 9, wherein:" should read: --The device of claim 9, wherein:--.

Column 6, Claim 12, Line 17:
"The device claim 11, wherein:" should read: --The device of claim 11, wherein:--.

Signed and Sealed this
First Day of August, 2023

Katherine Kelly Vidal
*Director of the United States Patent and Trademark Office*